United States Patent
Jeong et al.

(10) Patent No.: US 7,787,093 B2
(45) Date of Patent: Aug. 31, 2010

(54) ARRAY SUBSTRATE FOR A LIQUID CRYSTAL DISPLAY DEVICE WITH THIN FILM TRANSISTOR HAVING TWO DRAIN ELECTRODE PATTERNS AND MANUFACTURING METHOD OF THE SAME

(75) Inventors: Young-Sik Jeong, Seoul (KR); Dong-Hoon Lee, Gyeonggi (KR)

(73) Assignee: LG. Display Co., Ltd., Seoul (KR)

( * ) Notice: Subject to any disclaimer, the term of this patent is extended or adjusted under 35 U.S.C. 154(b) by 0 days.

(21) Appl. No.: 12/332,781

(22) Filed: Dec. 11, 2008

(65) Prior Publication Data

US 2009/0091678 A1    Apr. 9, 2009

Related U.S. Application Data

(62) Division of application No. 11/974,665, filed on Oct. 15, 2007, now Pat. No. 7,480,025, which is a division of application No. 10/991,755, filed on Nov. 17, 2004, now Pat. No. 7,301,597.

(30) Foreign Application Priority Data

Nov. 25, 2003    (KR) .......................... 2003-0084011

(51) Int. Cl.
*G02F 1/1343* (2006.01)
(52) U.S. Cl. ...................... 349/144; 349/139; 257/59; 257/72
(58) Field of Classification Search .................. 349/43, 349/48, 139, 141, 144; 257/59, 72
See application file for complete search history.

(56) References Cited

U.S. PATENT DOCUMENTS

| | | | | |
|---|---|---|---|---|
| 6,191,831 B1 * | 2/2001 | Kim et al. | ...................... | 349/43 |
| 6,819,385 B2 * | 11/2004 | Lu | .............. | 349/144 |
| 2002/0113914 A1 * | 8/2002 | Shiga et al. | ................... | 349/43 |
| 2003/0095223 A1 * | 5/2003 | Song | ......................... | 349/141 |

FOREIGN PATENT DOCUMENTS

KR    10-2003-0029218    4/2003

OTHER PUBLICATIONS

Office Action issued in corresponding Korean Patent Application No. 10-2003-0084011; issued Mar. 24, 2010.

\* cited by examiner

*Primary Examiner*—Michael H Caley
(74) *Attorney, Agent, or Firm*—Brinks Hofer Gilson & Lione

(57) ABSTRACT

An array substrate for a liquid crystal display device includes gate and data lines crossing on a substrate, common lines parallel to and between the gate lines, thin film transistors at crossing portions of the gate and data lines, and a pixel electrode. The common lines define pixel regions, which are each divided into first and second regions by the corresponding gate line. The thin film transistors each include a gate electrode in a first direction, a semiconductor layer on the gate electrode, and source and drain electrodes on the semiconductor layer in a second direction. The source and drain electrodes cross the gate electrode in each of the first and second regions. The pixel electrode is connected to the drain electrode.

10 Claims, 18 Drawing Sheets ial-
ARRAY SUBSTRATE FOR A LIQUID CRYSTAL DISPLAY DEVICE WITH THIN FILM TRANSISTOR HAVING TWO DRAIN ELECTRODE PATTERNS AND MANUFACTURING METHOD OF THE SAME The present application is a divisional of U.S. patent application Ser. No. 11/974,665 filed on Oct. 15, 2007, now U.S. Pat. No. 7,480,025 which is a divisional of U.S. patent application Ser. No. 10/991,755, filed on Nov. 17, 2004 now U.S. Pat. No. 7,301,597.

This application claims the benefit of Korean Patent Application No. 2003-0084011, filed in Korea on Nov. 25, 2003, which is hereby incorporated by reference for all purposes as if fully set forth herein.

BACKGROUND

1. Field

The invention relates to a liquid crystal display (LCD) device and more particularly, to an array substrate for the LCD device and a manufacturing method of the same.

2. Discussion of the Related Art

Liquid crystal display (LCD) devices have been spotlighted as a next generation display device having high value because of their low power consumption and good portability.

An LCD device uses alignment characteristics of liquid crystal molecules that change dependent upon the strength of an applied electric field. The LCD device displays a picture by varying transmittance of light incident from a lower side of the LCD device according to the arrangement (or rearrangement) of the liquid crystal molecules.

The LCD device includes an array substrate and a color filter substrate. Liquid crystal molecules are interposed between the array substrate and the color filter substrate. The array substrate includes gate and data lines that cross each other to define a pixel region, a thin film transistor that is formed at a crossing portion of the gate and data lines, and a pixel electrode that is formed in the pixel region. The color filter substrate includes a color filter layer that is composed of color filters, each of which corresponds to the pixel region, and a common electrode that is formed on an entire surface of the color filter substrate.

The thin film transistor receives signals from the gate and data lines, and the signal from the data line is provided to the pixel electrode through the thin film transistor according to the signal from the gate line.

Accordingly, the liquid crystal molecules are arranged according to an electric field induced between the pixel electrode and the common electrode, and a picture is displayed according to the arrangement of the liquid crystal molecules.

An array substrate for an LCD device of the related art will be described hereafter in detail with reference to figures.

FIG. 1 is an enlarged view showing a part of an array substrate for an LCD device according to the related art.

As shown in FIG. 1, a gate line 12 is formed in a first direction, and a data line 22 is formed in a second direction crossing the first direction. The gate line 12 and the data line 22 cross each other to define a pixel region P. A gate electrode 14 is formed at a crossing portion of the gate and data lines 12 and 22, and a semiconductor layer 16 is formed on the gate electrode 14. A source electrode 18 and a drain electrode 20 are formed on the semiconductor layer 16. The source electrode 18 extends from the data line 22 and overlaps a portion of the semiconductor layer 16. The drain electrode 20 is spaced from the source electrode 18. The gate electrode 14, the semiconductor layer 16, the source electrode 18 and the drain electrode 20 form a thin film transistor T. A pixel electrode 24 is formed in the pixel region P and is connected to the drain electrode 20.

Driving in the LCD device including the above-mentioned array substrate is affected by driving characteristics of the thin film transistor. More particularly, data signals input from the data line 22 may change due to parasitic capacitances induced between electrodes of the thin film transistor T.

The parasitic capacitances may be induced between the overlapped gate electrode 14 and source electrode 18 or between the overlapped gate electrode 14 and drain electrode 20. A parasitic capacitance induced between the overlapped gate electrode 14 and drain electrode 20 may be commonly designated as $C_{gd}$. The parasitic capacitance $C_{gd}$ changes according as an overlapped area of the gate electrode 16 and the drain electrode 20 varies, and the change of the parasitic capacitance $C_{gd}$ increases flicker or non-uniformity in images.

The change of the parasitic capacitance $C_{gd}$ may be caused by misalignment while the source and drain electrodes are formed on the semiconductor layer. That is, since the source and drain electrodes 18 and 20 may move up and down or left and right due to the misalignment, an overlapped area between the gate electrode 14 and the source and drain electrodes 18 and 20 may be changed, thereby causing the change of the parasitic capacitance.

The changed parasitic capacitance $C_{gd}$ changes an offset voltage $\Delta V_p$. The offset voltage $\Delta V_p$ is unavoidable in a structure of the LCD device but is adjustable. However, if the offset voltage $\Delta V_p$ is non-uniform, it is not effective to adjust the offset voltage $\Delta V_p$.

By newly designing the gate, source and drain electrodes of the thin film transistor, several trials have been made to overcome bad driving of the thin film transistor due to misalignment during manufacturing processes.

FIGS. 2 to 5 illustrate several structures of thin film transistors according to the related art.

FIG. 2 shows a thin film transistor having a U shape channel.

In FIG. 2, a source electrode 18 and a drain electrode 20 are formed over a gate electrode 14, which is a part of a gate line 12, and are spaced apart from each other. The source electrode 18 and the drain electrode 20 expose an active layer 16 in a U shape, thereby forming a U shape channel. The source electrode 18 has a U shape and the drain electrode 20 has a rod shape. One end of the drain electrode 20 is enclosed by the source electrode 18. The source electrode 18 is entirely disposed within the gate electrode 14 from a plan view, and the drain electrode 20. The drain electrode 20 is formed in a direction crossing the gate electrode 14, more particularly, the gate line 12.

In the above structure, the ratio of width to length of a channel may be large, thereby improving driving properties of the thin film transistor. Since the source electrode 18 is disposed within the gate electrode 14, an overlapping area of the source electrode 18 and the gate electrode 14 scarcely changes even if misalignment occurs during the processes.

However, an overlapping area of the drain electrode 20 and the gate electrode 14 still changes when misalignment occurs up and down in the context of the figure.

FIG. 3 shows a thin film transistor having another U shape channel, which is rotated clockwise about 45 degrees with respect to the U shape channel of FIG. 2. In FIG. 3, the drain electrode 20 has an angle of about 45 degrees with respect to the gate line 12. The gate electrode 14 protrudes from the gate line 12, and has an inclined side, which overlaps the drain electrode 20, with respect to the gate line 12.

In the structure of FIG. 3, an aperture area of a pixel region may be increased, but an overlapping area of the drain electrode 20 and the gate electrode also may change.

FIG. 4 shows a thin film transistor having another U shape channel, which is rotated clockwise about 90 degrees with respect to the U shape channel of FIG. 2. In FIG. 4, the gate electrode 14 protrudes from the gate line 12, and has sides substantially perpendicular to the gate line 12.

In the structure of FIG. 4, an overlapping area of the drain electrode 20 and the gate electrode 14 changes by rather a large amount when misalignment occurs.

FIG. 5 shows a thin film transistor having an L shape channel. In FIG. 5, the source electrode 18 has an L shape, and the drain electrode 20 is spaced apart from the source electrode 18 such that an L shape side of the drain electrode 20 faces the source electrode 18. In the structure of FIG. 5, an overlapping area of the drain electrode 20 and the gate electrode 14 also changes by a rather large amount when misalignments occur up and down or left and right in the context of the figure.

The above-mentioned structures may improve driving properties of the thin film transistor, but may cause changes in the overlapping area of the gate electrode 14 and the drain electrode 20 when misalignments occur.

SUMMARY

By way of introduction only, in one embodiment, a thin film transistor includes a gate electrode extending in a first direction, a semiconductor layer on the gate electrode, and source and drain electrodes on the semiconductor layer. The drain electrode crosses the entire gate electrode.

In various embodiments, which may be combined in any manner, the drain electrode includes first and second patterns and the source electrode is disposed between the first and second patterns. The source and drain electrodes extend in the same direction. The drain electrode extends in a direction substantially orthogonal to the first direction. The drain electrode extends in multiple directions. The source electrode crosses the entire gate electrode and the entire gate line. The drain electrode is substantially longer than the gate electrode, in which case a length of a portion of the drain electrode that covers the gate electrode may be at most twice a length of a portion of the drain electrode that does not cover the gate electrode. The drain electrode may be substantially symmetric or substantially non-symmetrical around the gate electrode.

In another embodiment, an array substrate for a liquid crystal display device includes a gate line, common lines parallel to the gate line, a data line crossing the gate line and the common lines to define a pixel region, and a thin film transistor at a crossing portion of the gate and data lines. The gate line is disposed between the common lines. The pixel region is divided into first and second regions by the gate line. The thin film transistor includes a gate electrode in a first direction, a semiconductor layer on the gate electrode, and source and drain electrodes on the semiconductor layer. The drain electrode crosses the entire gate electrode. A pixel electrode is disposed in each of the first and second regions and is connected to the drain electrode.

In another embodiment, a method of manufacturing an array substrate for a liquid crystal display device includes forming a gate line on a substrate, forming common lines parallel to the gate line, the gate line being disposed between the common lines, forming a data line crossing the gate line and the common lines to define a pixel region, which is divided into first and second regions by the gate line, forming a thin film transistor at a crossing portion of the gate and data lines, and forming a pixel electrode in each of the first and second regions, the pixel electrode connected to the drain electrode. The thin film transistor includes a gate electrode in a first direction, a semiconductor layer on the gate electrode, and source and drain electrodes on the semiconductor layer. The drain electrode crosses the entire gate electrode.

It is to be understood that both the foregoing general description and the following detailed description are exemplary and explanatory and are intended to provide further explanation of the invention as claimed. Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to embodiments of the invention, which are illustrated in the accompanying drawings.

Figure 1:
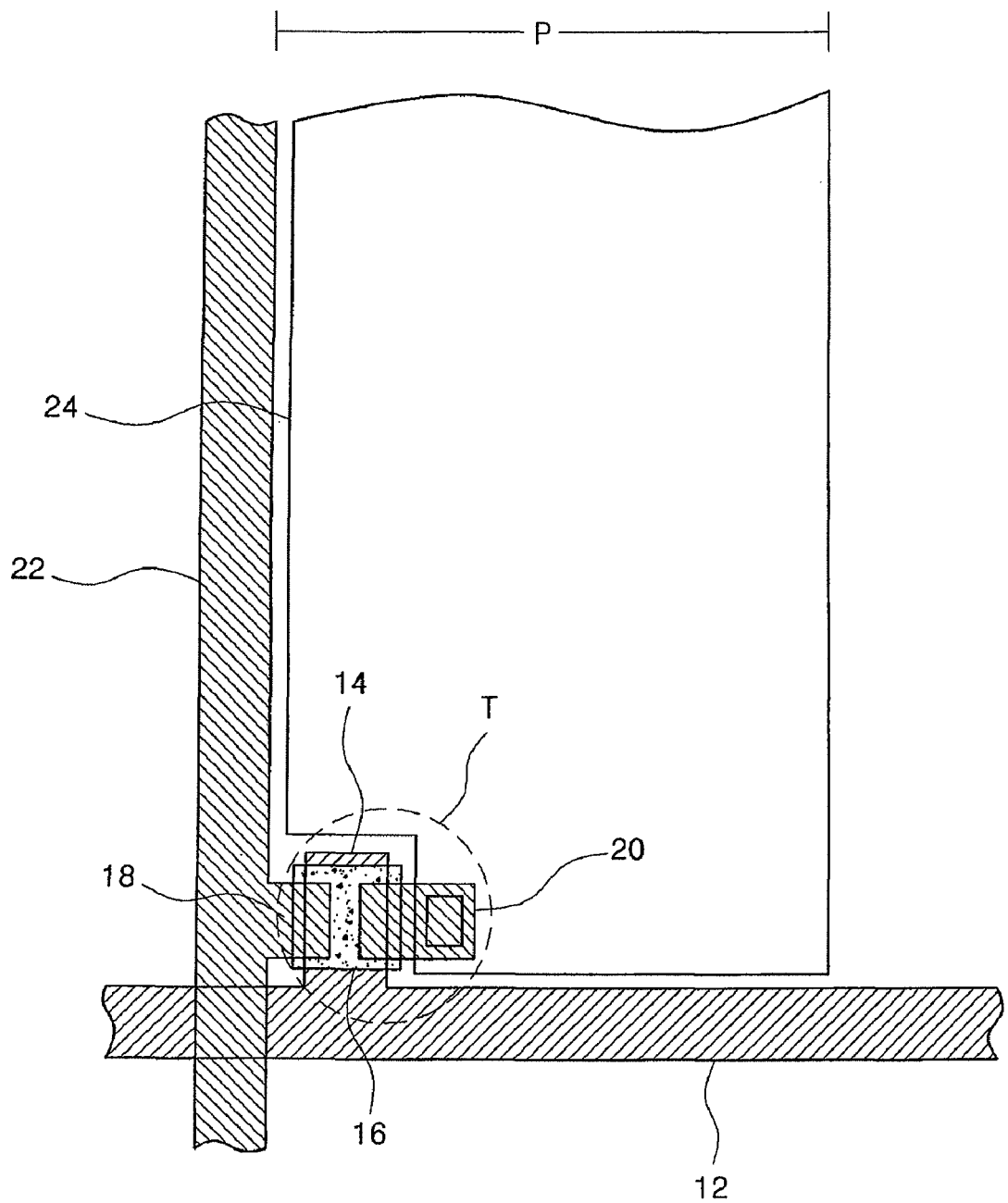
FIG. 1 is an enlarged view showing a part of an array substrate for an LCD device according to the related art.
Figure 2:
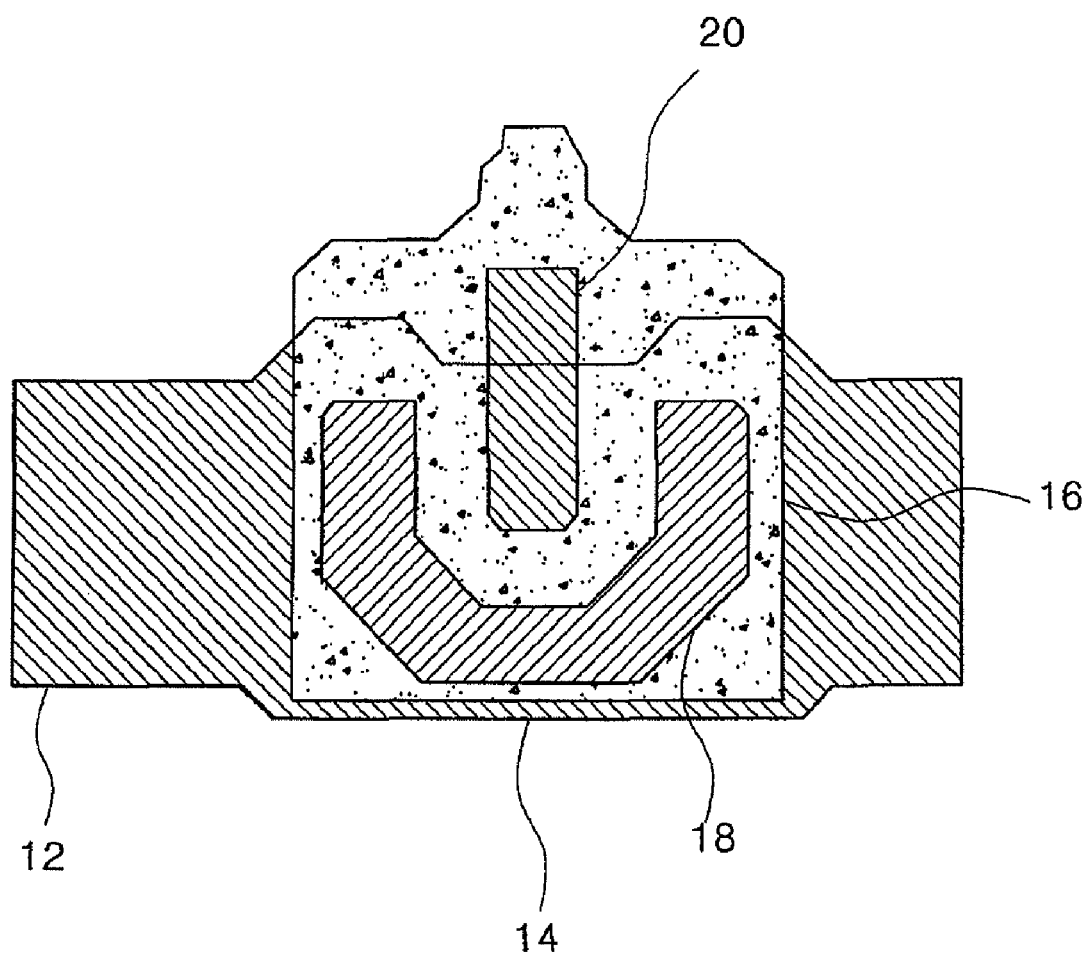
FIG. 2 is a plan view of a thin film transistor having a U shape channel according to the related art.
Figure 3:
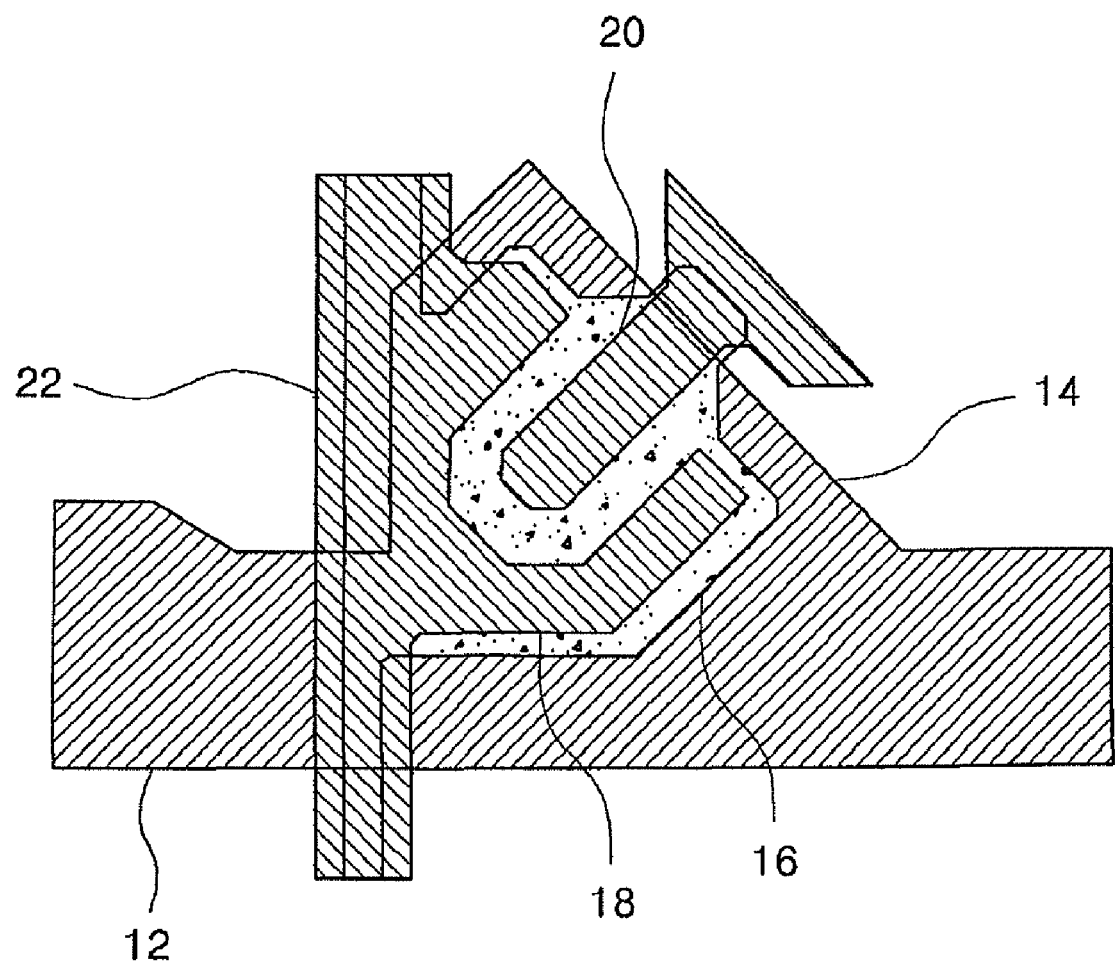
FIG. 3 is a plan view of a thin film transistor having another U shape channel according to the related art.
Figure 4:
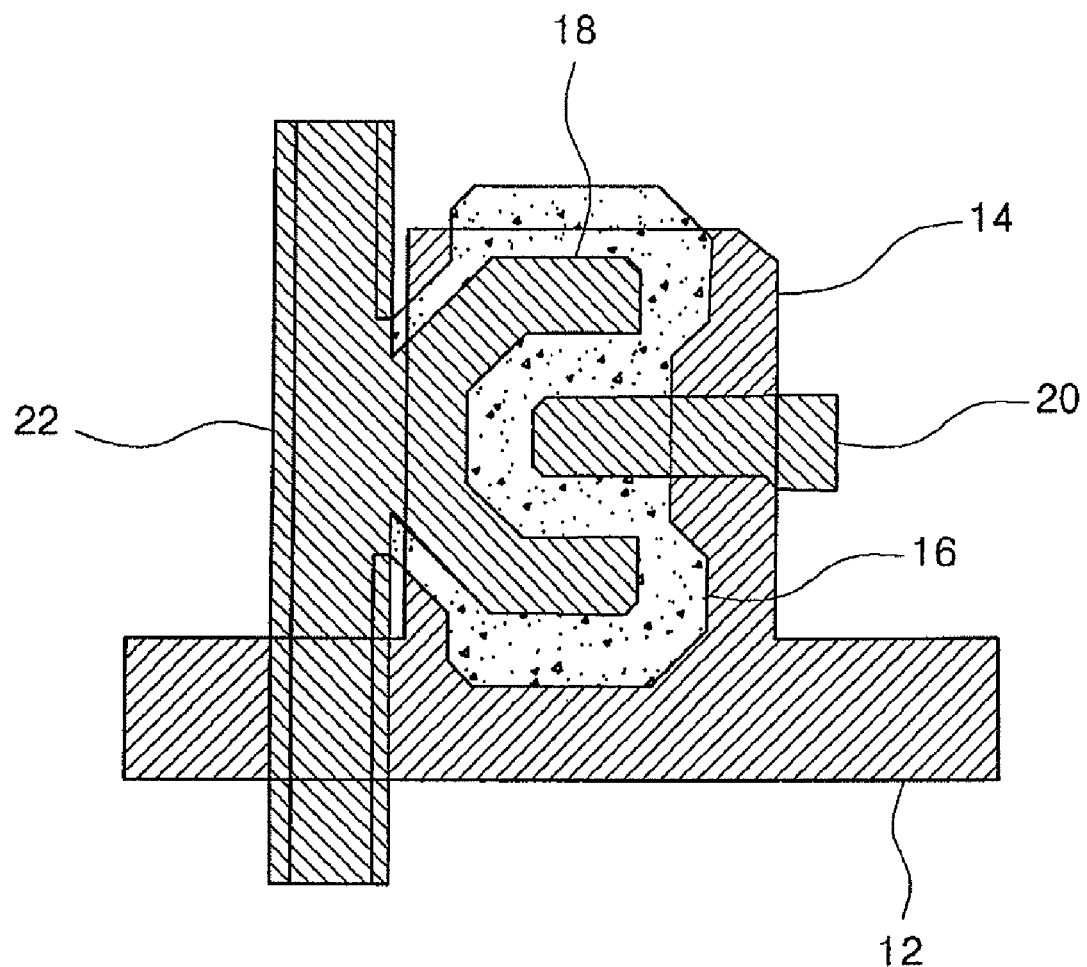
FIG. 4 is a plan view of a thin film transistor having another U shape channel according to the related art.
Figure 5:
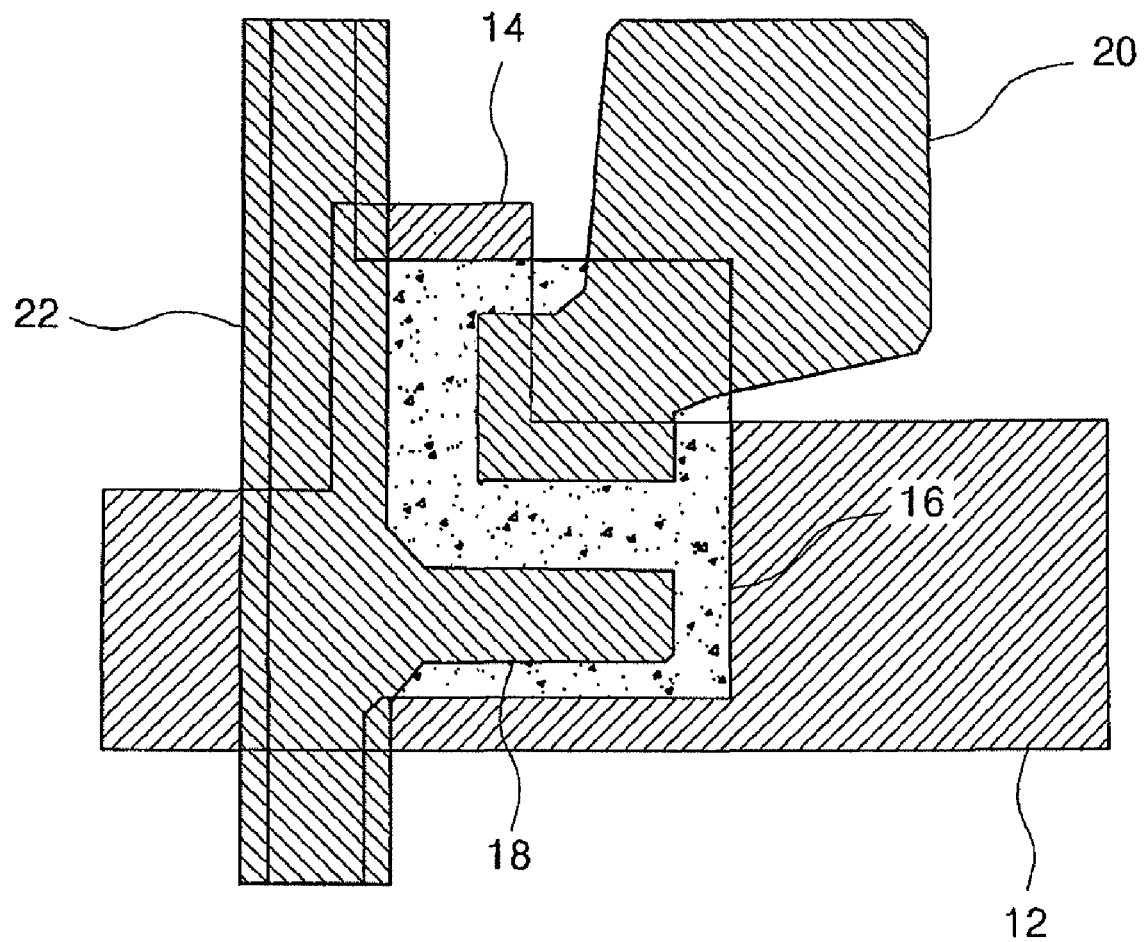
FIG. 5 is a plan view of a thin film transistor having an L shape channel according to the related art.
Figure 6:
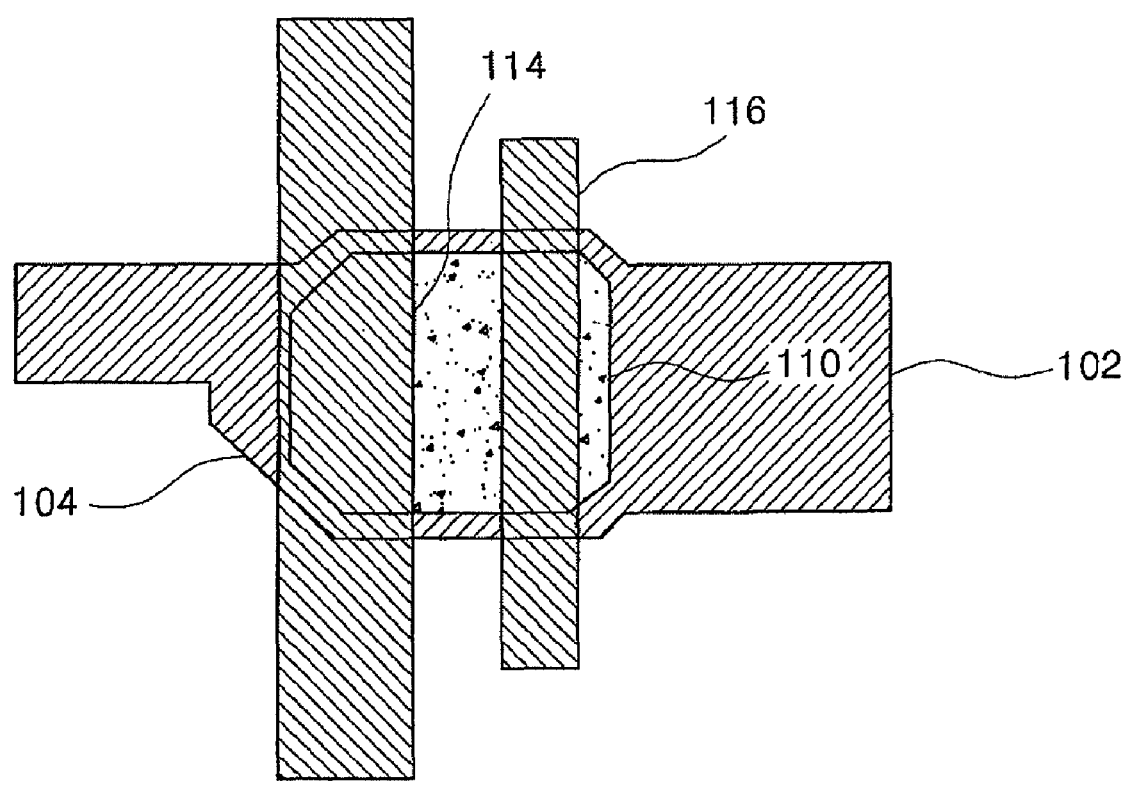
FIG. 6 is a plan view illustrating a structure of a thin film transistor according to the present invention.

FIG. 6 illustrates a structure of a thin film transistor according to one embodiment of the present invention.

In FIG. 6, a gate line 102 is formed in a first direction, and a part of a gate line 102 functions as a gate electrode 104. A source electrode 114 and a drain electrode 116 are formed over the gate electrode 104 and are spaced apart from each other. An active layer 110 is formed between the gate electrode 104 and the source and drain electrodes 114 and 116.

The source electrode 114 and the drain electrode 116 have a rod shape of a second direction crossing the first direction. The gate electrode 104 may have a larger width than other parts of the gate line 102. The source electrode 114 and the drain electrode 116 perpendicularly cross the gate electrode 104.

Although misalignment occurs up and down or left and right when the source and drain electrodes are formed, an overlapping area of the gate electrode and the source and drain electrodes does not change. Accordingly, a parasitic capacitance $C_{gd}$ formed from the overlapped gate and drain electrodes does not change, and an offset voltage $\Delta V_p$ also does not change.

Figure 7:
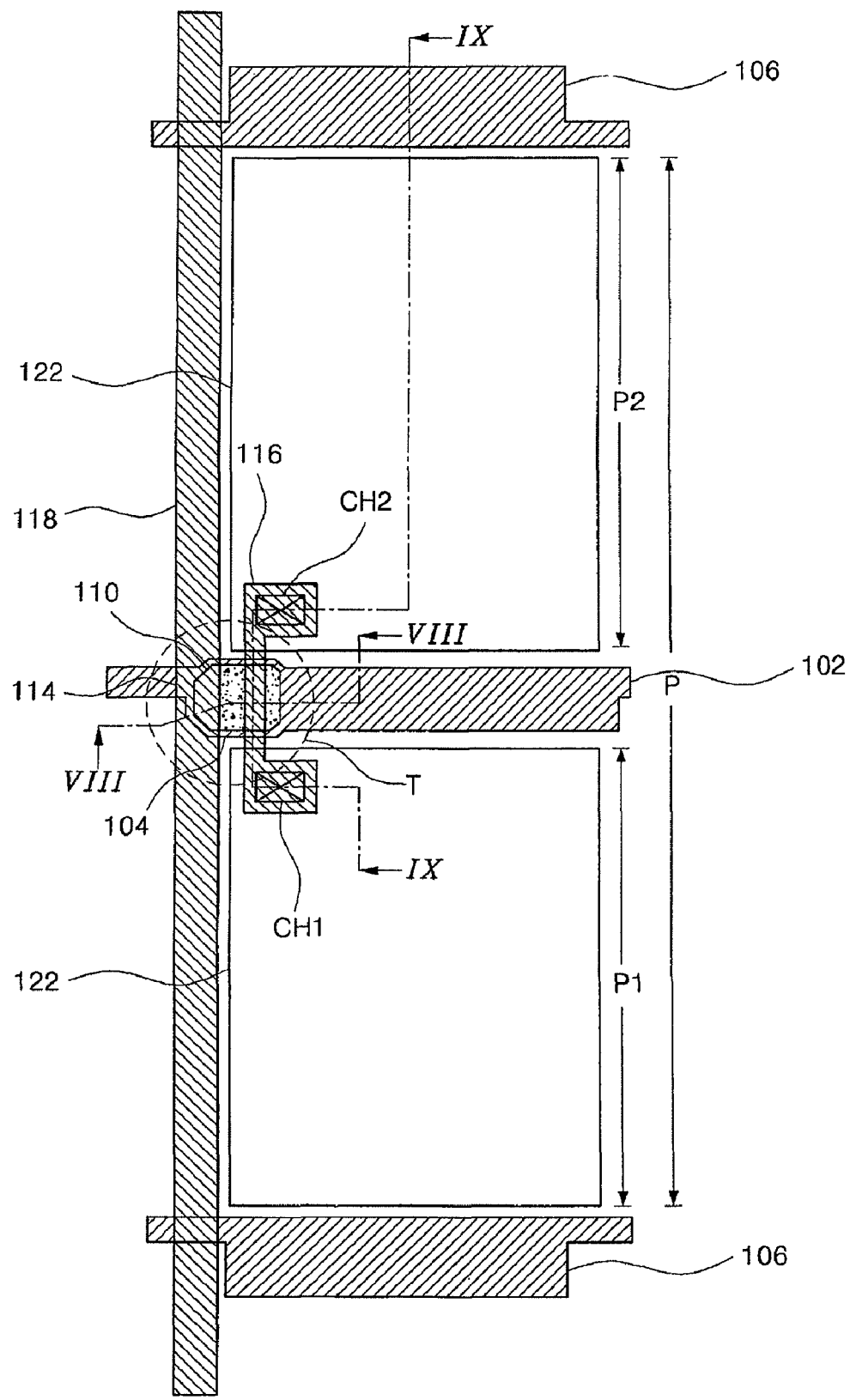
FIG. 7 is a plan view of an array substrate for an LCD device according to a first embodiment of the present invention.

FIG. 7 is a plan view of an array substrate for an LCD device according to a first embodiment of the present invention, and the array substrate includes the above-mentioned structure of the thin film transistor.

As shown in FIG. 7, a gate line 102 is formed in a first direction, and two common lines 106 parallel to the gate line 102 are formed such that the gate line 102 is disposed between the common lines 106. A data line 118 is formed in a second direction perpendicular to the first direction. The data line 118 crosses the gate line 102 and the common lines 106 to define a pixel region P, which includes a first region P1 and a second region P2 adjacent to each other in the second direction. The gate line 102 goes across a middle portion of the pixel region P, and thus the pixel region P is divided into the first and second regions P1 and P2.

A thin film transistor T is formed at a crossing portion of the gate and data lines 102 and 118. The thin film transistor T includes a gate electrode 104, a semiconductor layer 110, a source electrode 114 and a drain electrode 116. The gate electrode 104 is a part of the gate line 102, and the source electrode 114 is a part of the data line 118. The semiconductor layer 110 has an island shape and is disposed between the gate electrode 104 and the source and drain electrodes 114 and 116. The source and drain electrodes 114 and 116 have a rod shape of the second direction and cross the gate electrode 104. The drain electrode 116 extends upward and downward with respect to the gate line 102 in the context of the figure. The drain electrode 116 may have end portions larger than a middle portion between the end portions of the drain electrode 116. The middle portion of the drain electrode 116, which overlaps the gate electrode 104, may have a length larger than a width of the gate electrode 104.

A pixel electrode 122 is formed in each of the first and second regions P1 and P2. The pixel electrode 122 is connected to the end portion of the drain electrode 116 in each of the first and second regions P1 and P2. The pixel electrode 122 overlaps the common line 106 in each of the first and second regions P1 and P2 to form a storage capacitor, wherein the common line 106 functions as a first electrode and the pixel electrode 122 serves as a second electrode.

In FIG. 7, a switching element, the thin film transistor T, drives two divided regions of one pixel region. Since the drain electrode 116 crosses the gate electrode 104, not the gate line 102, an overlapping area of the gate electrode 104 and the drain electrode 116 does not change even if the drain electrode 116 is misaligned with the gate electrode 104 during the manufacturing processes. Therefore, the offset voltage $\Delta V_p$ due to a parasitic capacitance $C_{gd}$ between the gate and drain electrodes 104 and 116 does not change, and thus a high quality LCD device can be manufactured.

FIGS. 8A to 8E and FIGS. 9A to 9E illustrate a manufacturing method of an array substrate for an LCD device according to the first embodiment of the present invention. FIGS. 8A to 8E are cross-sectional views corresponding to the line VIII-VIII of FIG. 7 and FIGS. 9A to 9E are cross-sectional views corresponding to the line IX-IX of FIG. 7.

Figure 8A:
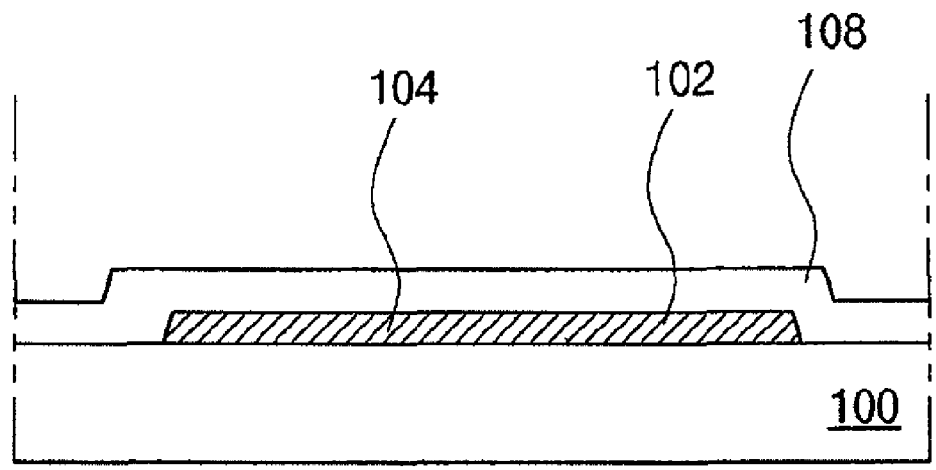
FIGS. 8A to 8E are cross-sectional views illustrating a manufacturing method of an array substrate for an LCD device according to the first embodiment and corresponding to the line VIII-VIII of FIG. 7.
Figure 9A:
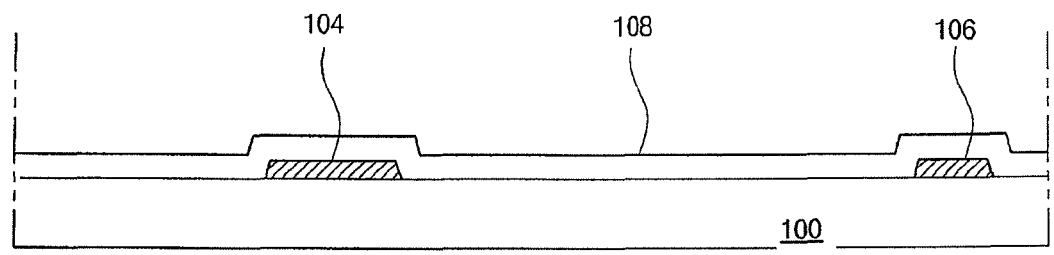
FIGS. 9A to 9E are cross-sectional views illustrating a manufacturing method of an array substrate for an LCD device according to the first embodiment and corresponding to the line IX-IX of FIG. 7.

In FIGS. 8A and 9A, a gate line 102 and common lines 106 are formed on a substrate 100 by depositing a metallic material and then patterning the metal material. The metallic material may be selected from a group including aluminum (Al), an aluminum alloy, chromium (Cr), and tungsten (W). A part of the gate line 102 functions as a gate electrode 104. As stated above, the common lines 106 are parallel to the gate line 102, and the gate line 102 is disposed between the common lines 106.

Next, a gate insulating layer 108, as a first insulating layer, is formed on an entire surface of the substrate 100 including the gate line 102 and the common lines 106 thereon by depositing one or more inorganic materials such as silicon nitride ($SiN_x$) and/or silicon oxide ($SiO_2$).

Figure 8B:
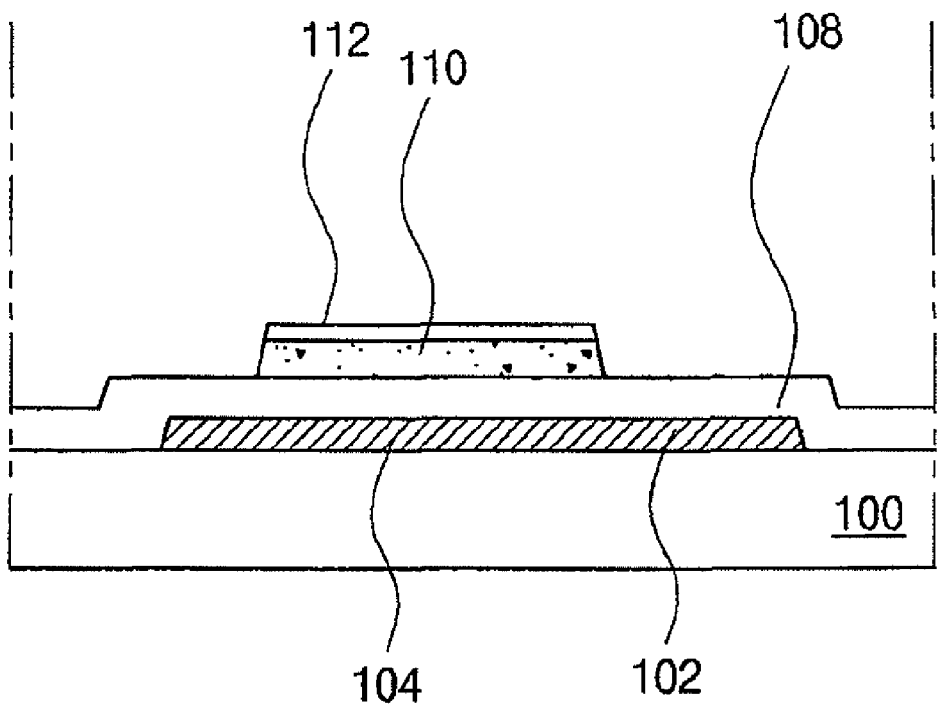
Figure 9B:
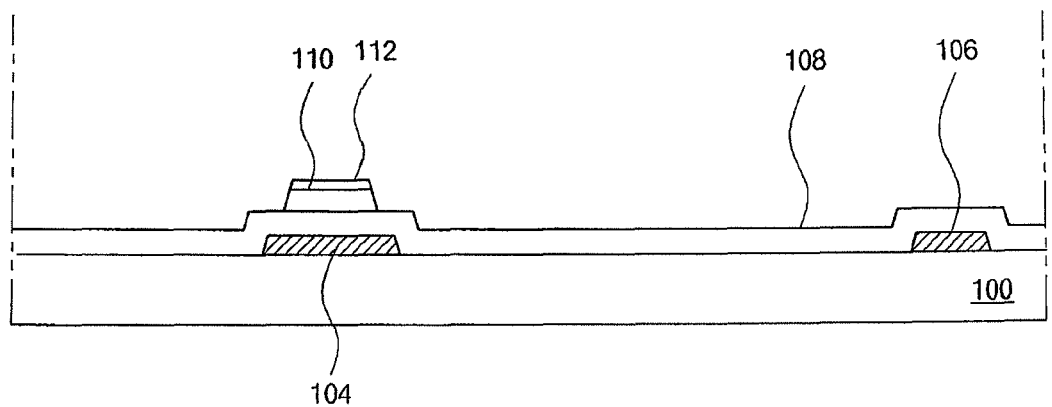

In FIGS. 8B and 9B, an active layer 110 and an ohmic contact layer 112 are sequentially formed on the gate insulating layer 108 over the gate electrode 104 by depositing undoped amorphous silicon and impurity-doped amorphous silicon and then patterning them.

Figure 8C:
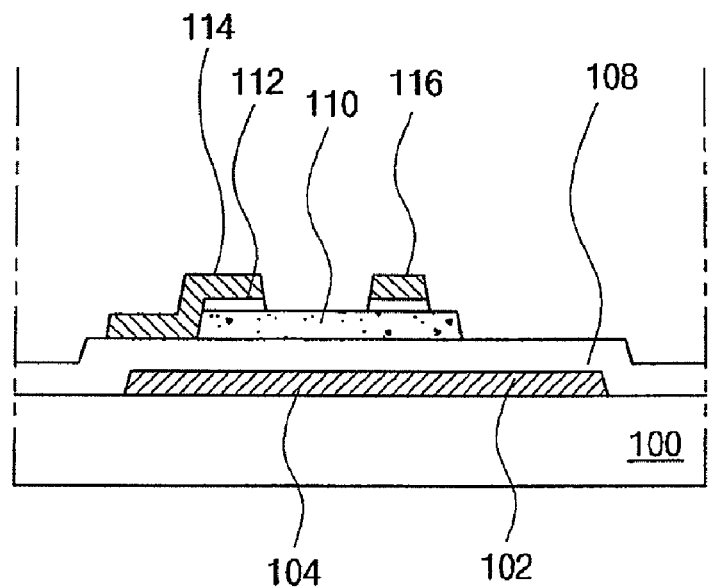
Figure 9C:
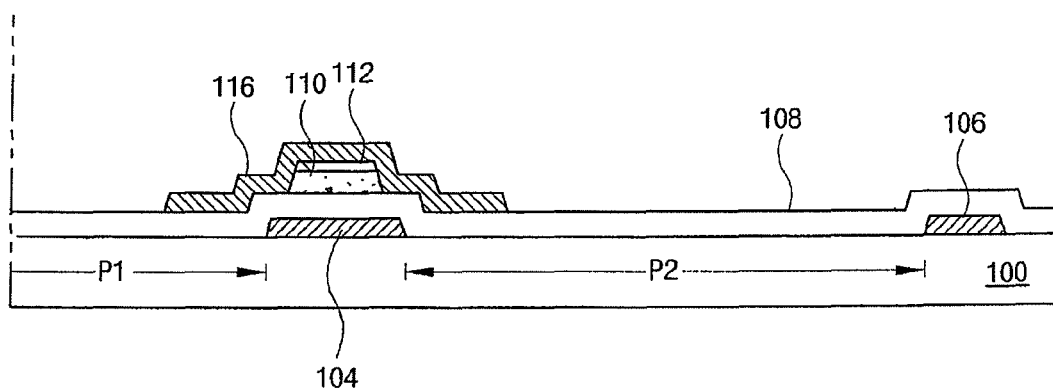

In FIGS. 8C and 9C, a source electrode 114 and a drain electrode 116 are formed on the ohmic contact layer 112 by depositing one or more metallic materials on an entire surface of the substrate 100 including the active layer 110 and the ohmic contact layer 112 thereon and then patterning the metallic material. Next, the ohmic contact layer 112 exposed by the source and drain electrodes 114 and 116 is removed. The metallic material may be chromium (Cr), tungsten (W), molybdenum (Mo), titanium (Ti), tantalum (Ta) and/or copper (Cu) for example. The source and drain electrodes 114 and 116 are spaced apart from each other. At this time, a data line 118 of FIG. 7 is also formed, wherein the source electrode 114 may be a part of the data line 118.

Although not shown in the figure, the data line 118 crosses the gate line 102 and the common lines 106, and the source and drain electrodes 114 and 116 also cross the gate electrode 104. The data line 118 defines a pixel region with the common lines 106. The pixel region is divided into a first region P1 and a second region P2 by the gate line 102.

Figure 8D:
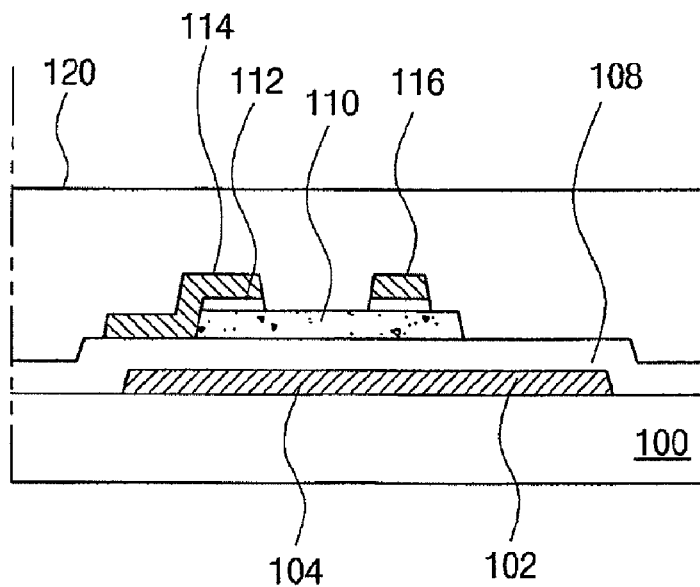
Figure 9D:
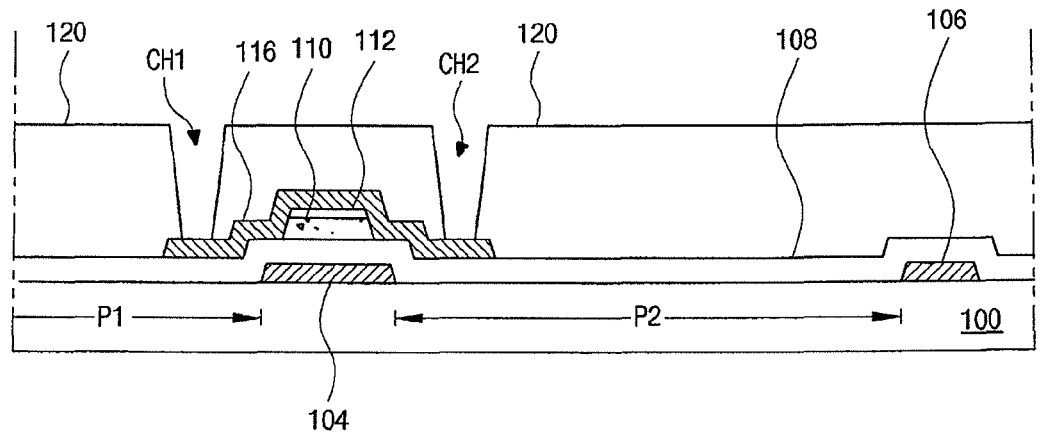

In FIGS. 8D and 9D, a passivation layer 120 is formed on an entire surface of the substrate 100 including the source and drain electrodes 114 and 116 thereon by depositing an inorganic material such as silicon nitride ($SiN_x$) and/or silicon oxide ($SiO_2$) or coating an organic material such as benzocyclobutene (BCB) and/or acrylic resin. Next, the passivation layer 120 is patterned to form a first contact hole CH1 and a second contact hole CH2. The first contact hole CH1 and the second contact hole CH2 expose respective parts of the drain electrode 116, which are disposed in the first and second regions P1 and P2, respectively.

Figure 8E:
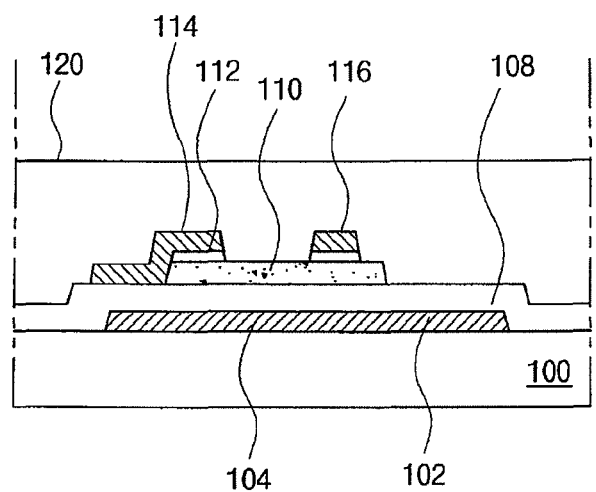
Figure 9E:
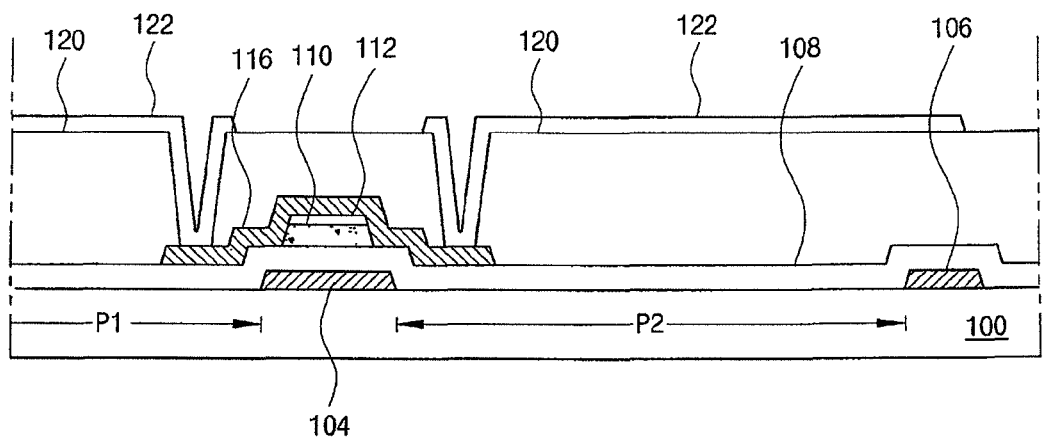

In FIGS. 8E and 9E, a pixel electrode 122 is formed on the passivation layer 120 in each of the first and second regions P1 and P2 by depositing a transparent conductive material, such as indium tin oxide (ITO) and/or indium zinc oxide (IZO), on an entire surface of the substrate 100 including the first and second contact holes CH1 and CH2 and then patterning the transparent conductive material. The pixel electrode 122 in the first region P1 is connected to the drain electrode 116 through the first contact hole CH1. The pixel electrode 122 in the second region P2 is connected to the drain electrode 116 through the second contact hole CH2.

Figure 10:
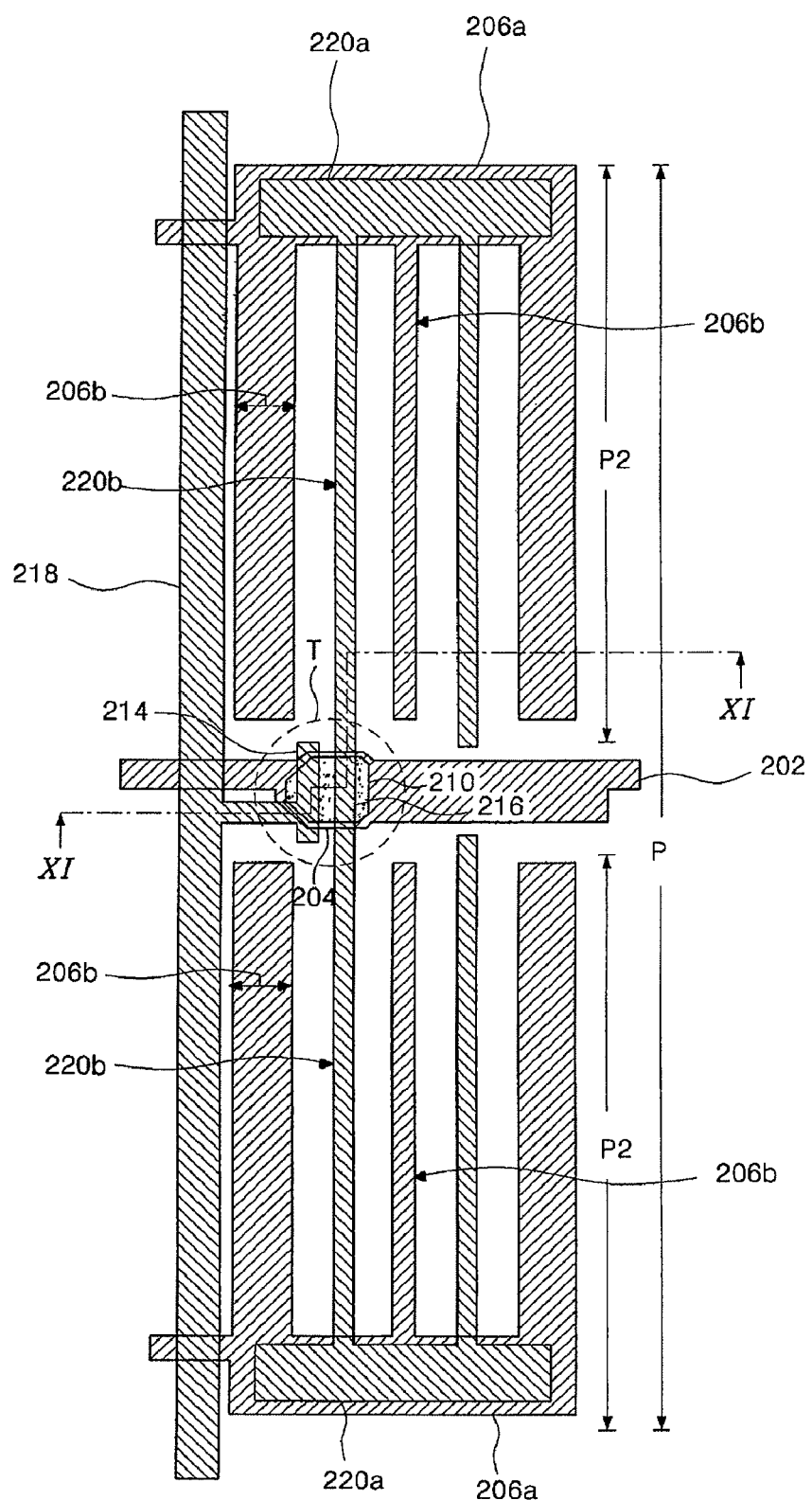
FIG. 10 is a plan view of an array substrate for an LCD device according to a second embodiment of the present invention.

FIG. 10 is a plan view of an array substrate for an LCD device according to a second embodiment of the present invention and shows an array substrate for an in-plane switching LCD device.

In FIG. 10, a gate line 202 is formed in a first direction and a data line 218 is formed in a second direction. Common lines 206a are formed parallel to the gate line 202 such that the gate line 202 is disposed between the common lines 206a. The data line 218 crosses the gate line 202 and the common lines 206a to define a pixel region P. The gate line 202 goes across the pixel region P, and thus the pixel region P is divided into first and second regions P1 and P2.

A thin film transistor T is formed at a crossing portion of the gate and data lines 202 and 218. The thin film transistor T includes a gate electrode 204, a semiconductor layer 210, a source electrode 214 and a drain electrode 216. The semiconductor layer 210 is disposed between the gate electrode 202 and the source and drain electrodes 214 and 216. The gate electrode 214 is a part of the gate line 202, and the semiconductor layer 210 has an island shape. The source and drain electrodes 214 and 216 have a rod shape along the second direction, and the source and drain electrodes 214 and 216 cross the gate electrode 204. The source electrode 214 extends from the data line 218, and the source electrode 214 may be a part of the data line 218.

A common electrode 206b is formed in each of the first and second regions P1 and P2 of the pixel region P. The common electrode 206b includes a plurality of patterns, which extend from the common line 206a in each of the first and second regions P1 and P2 along the second direction. A pixel connecting line 220a of the first direction is formed in each of the first and second regions P1 and P2, and the pixel connecting line 220a overlaps the common line 206a in each of the first and second regions P1 and P2 to form a storage capacitor. A pixel electrode 220b is formed in each of the first and second regions P1 and P2. The pixel electrode 220b includes a plurality of patterns of the second direction. The patterns of the pixel electrode 220b are connected to the pixel connecting line 220a in each of the first and second regions P1 and P2. The patterns of the pixel electrode 220b alternate with the patterns of the common electrode 206b in each of the first and second regions P1 and P2. One pattern of the pixel electrode 220b in each of the first and second regions P1 and P2 is connected to the drain electrode 216.

In this embodiment, the drain electrode 216 crosses the gate electrode 204 and is substantially fully disposed within the gate electrode 204. Thus, although the drain electrode 216 may be misaligned during the fabrication processes, an overlapping area of the drain electrode 214 and the gate electrode 204 does not change. Accordingly, an offset voltage $\Delta V_p$ due to the change of a parasitic capacitance $C_{gd}$ may be unchanged, whereby a high quality in-plane switching (IPS) LCD device can be manufactured.

Figure 11A:
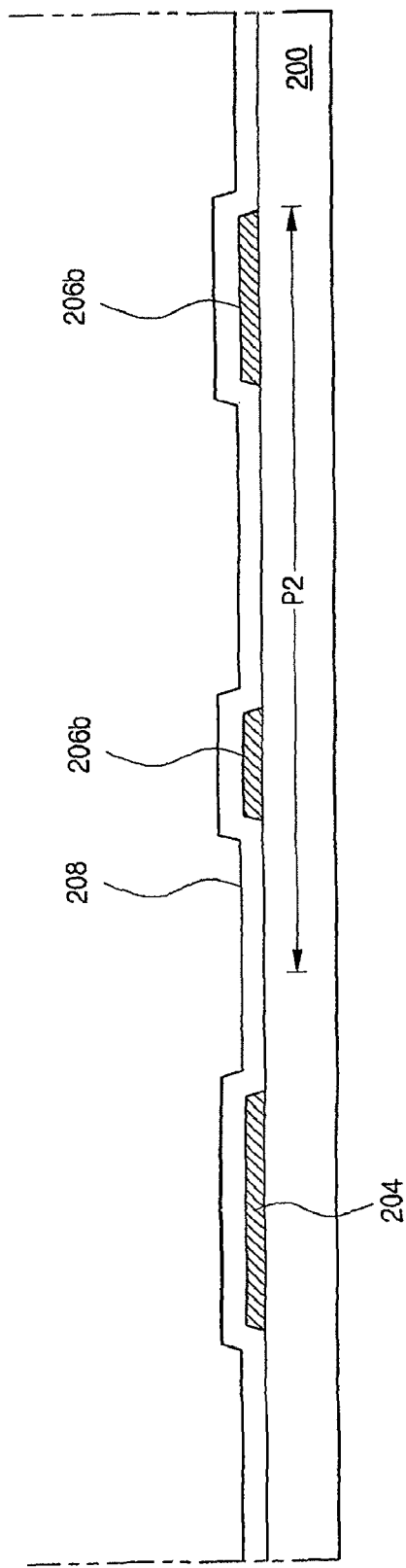
FIGS. 11A to 11C are cross-sectional views illustrating a manufacturing method of an array substrate for an LCD device according to the second embodiment and corresponding to the line XI-XI of FIG. 10.
Figure 11B:
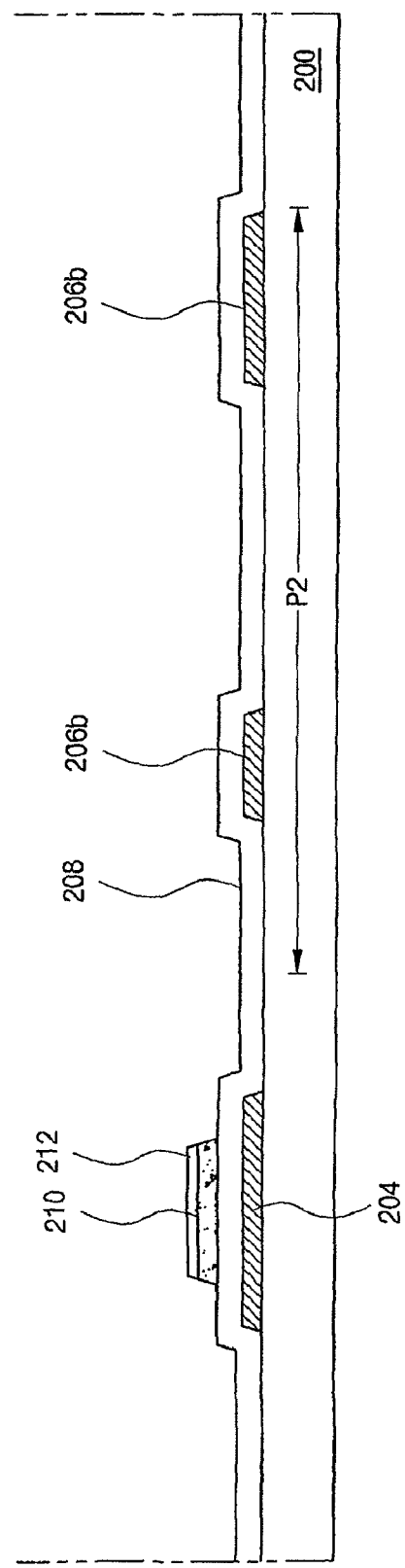
Figure 11C:
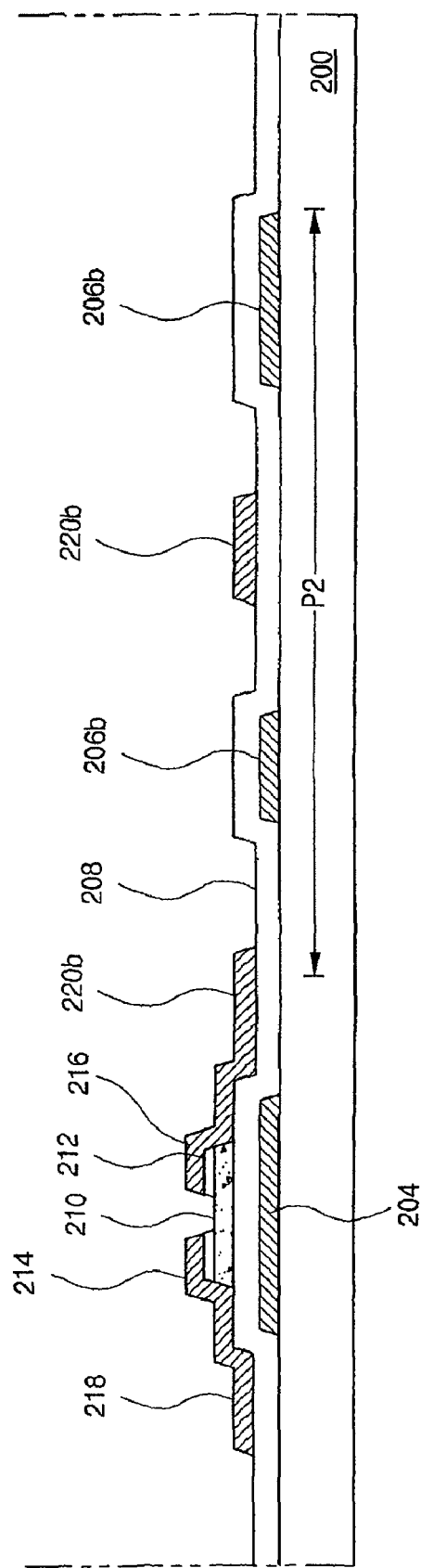

FIGS. 11A to 11C illustrate a manufacturing method of an array substrate for an LCD device according to the second embodiment of the present invention and are cross-sectional views corresponding to the line XI-XI of FIG. 10.

In FIG. 11A, a gate electrode 204 is formed on a substrate 200 by depositing a metal such as aluminum (Al), aluminum alloy, chromium (Cr) and/or tungsten (W) and then patterning it. The gate electrode 204 may be a part of a gate line (not shown). A common electrode 206b is formed simultaneously with the gate electrode 204 in each of a first region P1 of FIG. 10 and a second region P2, which are separated by the gate line and are defined by the gate line, a common line (not shown) and a data line (to be formed later). The common electrode 206b includes a plurality of patterns. Although not shown in the figure, the common electrode 206b is connected to the common line, which is disposed in each of the first and second regions P1 and P2 and is parallel to the gate line.

Next, a gate insulating layer 208 is formed on an entire surface of the substrate 200 including the gate electrode 204 and the common electrode 206b by depositing an inorganic material such as silicon nitride ($SiN_x$) and/or silicon oxide ($SiO_2$).

In FIG. 11B, an active layer 210 and an ohmic contact layer 212 are formed on the gate insulating layer 208 over the gate electrode 204 by subsequently depositing undoped amorphous silicon and impurity-doped amorphous silicon and then patterning them. The active layer 210 may be disposed within the gate electrode 204.

In FIG. 11C, a data line 218, a source electrode 214 and a drain electrode 216 are formed on the ohmic contact layer 212 by depositing a metallic material on an entire surface of the substrate 200 including the active layer 210 and the ohmic contact layer 212 thereon and then patterning the metallic material. Next, the ohmic contact layer 212 exposed by the source and drain electrodes 214 and 216 is removed. The metallic material may be chromium (Cr), tungsten (W), molybdenum (Mo), titanium (Ti), tantalum (Ta) and/or copper (Cu). The source and drain electrodes 214 and 216 are disposed over the gate electrode 204 and are spaced apart from each other. The source electrode 214 is connected to the data line 218. As stated before, the data line 218 crosses the gate line and the common lines to define a pixel region, which includes the first and second regions P1 and P2, and the source and drain electrodes 214 and 216 cross the gate electrode 204.

A pixel electrode 220b is formed simultaneously with the source and drain electrodes 214 and 216 in each of the first and second regions P1 and P2. The pixel electrode 220b includes a plurality of patterns, and one pattern of the pixel electrode 220b is connected to the drain electrode 216. Thus the pixel electrodes 220b in the first and second regions P1 and P2 are electrically connected to each other. The patterns of the pixel electrode 220b alternate with the patterns of the common electrode 206b in each of the first and second regions P1 and P2. Although not shown in the figure, the pixel electrode 220b is connected to a pixel connecting line in each of the first and second regions P1 and P2. The pixel connecting line is parallel to the gate line, and the pixel connecting line overlaps the common line to form a storage capacitor.

Figure 12:
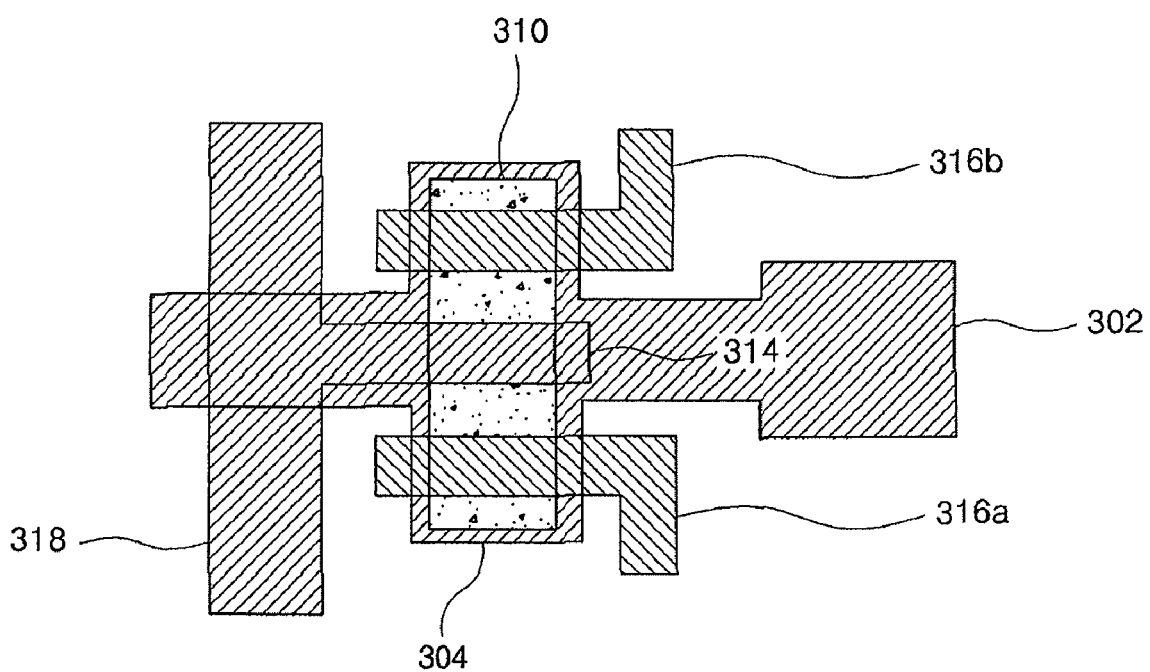
FIG. 12 is a plan view illustrating a structure of another thin film transistor according to the present invention.

FIG. 12 illustrates a structure of a thin film transistor according to another embodiment of the present invention.

In FIG. 12, a gate electrode 304 extends from a gate line 302, which is formed in a first direction, along a second direction. A source electrode 314 and a drain electrode 316a and 316b are formed in the first direction. A semiconductor layer 310 is disposed between the gate electrode 304 and the source and drain electrodes 314 and 316a and 316b. The source electrode 314 extends from a data line 318, which is formed in the second direction. The drain electrode includes first and second patterns 316a and 316b, and the source electrode 314 is disposed between the first and second patterns 316a and 316b. The source electrode 314 substantially entirely overlaps the gate electrode 304 and the gate line 302. The drain electrode 316a and 316b crosses the gate electrode 304 extending from the gate line 302 upward and downward in the context of the figure.

In the structure of FIG. 12, although the source electrode 314 and the drain electrode 316a and 316b are misaligned with the gate electrode 304, overlapping areas of the gate electrode 304 and the source and drain electrodes 314 and 316a and 316b do not change.

Figure 13:
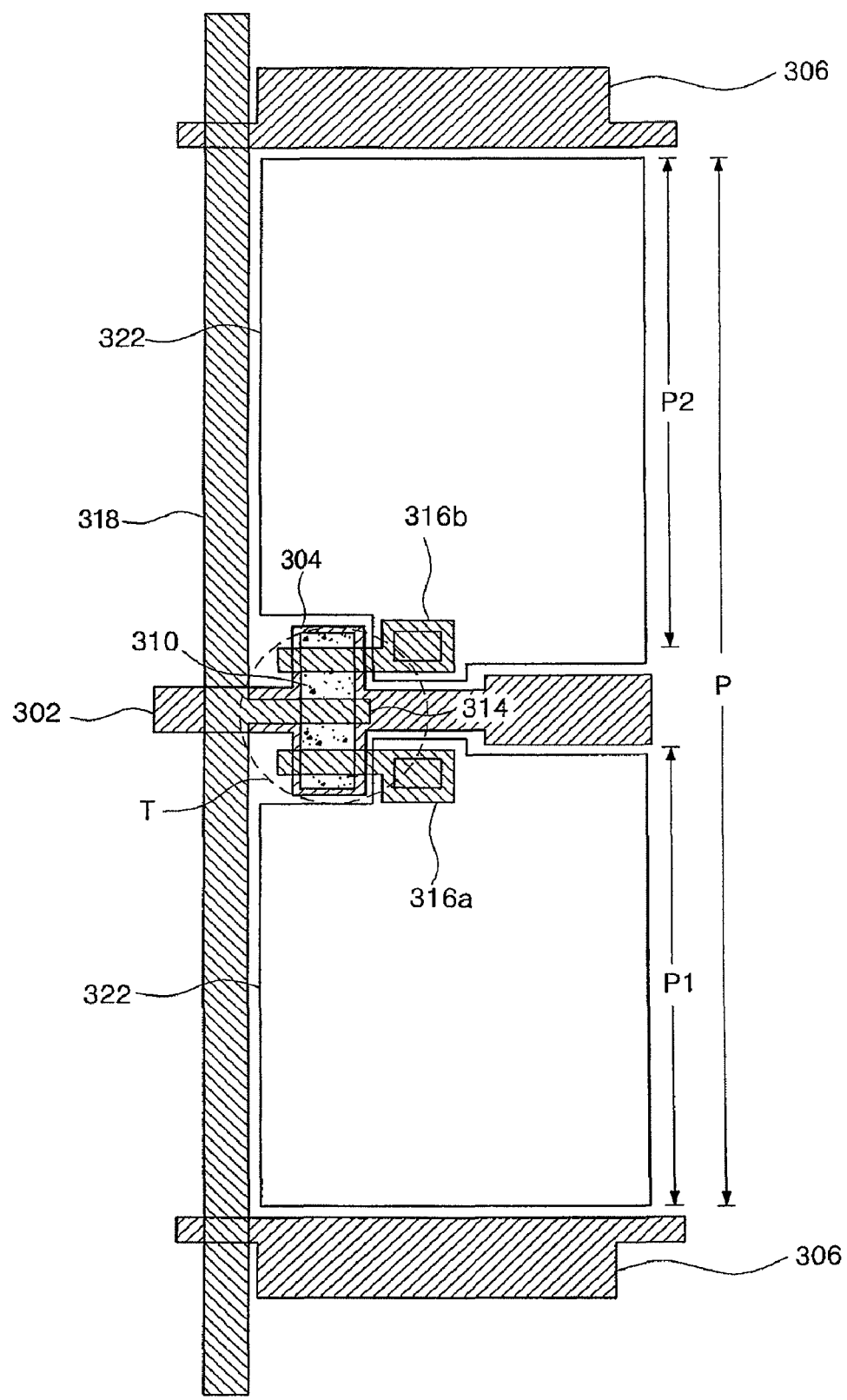
FIG. 13 is a plan view of an array substrate for an LCD device according to a third embodiment of the present invention.

FIG. 13 is a plan view of an array substrate for an LCD device according to a third embodiment of the present invention, and the array substrate includes the thin film transistor illustrated in FIG. 12.

As shown in FIG. 13, a gate line 302 is formed in a first direction and two common lines 306 parallel to the gate line 302 are formed such that the gate line 302 is disposed between the common lines 306. A data line 318 is formed in a second direction perpendicular to the first direction. The data line 318 crosses the gate line 302 and the common lines 306 to define a pixel region P, which includes a first region P1 and a second region P2 adjacent to each other in the second direction. The pixel region P is divided into the first and second regions P1 and P2 by the gate line 302.

A thin film transistor T is formed at a crossing portion of the gate and data lines 302 and 318. The thin film transistor T includes a gate electrode 304, a semiconductor layer 310, a source electrode 314 and a drain electrode 316a and 316b. The gate electrode 304 extends from the gate line 302 in the second direction. The semiconductor layer 310 has an island shape and is disposed between the gate electrode 304 and the source and drain electrodes 314 and 316a and 316b. The source electrode 314 extends from the data line 318 in the first direction. The drain electrode includes first and second patterns 316a and 316b, and the first and second patterns 316a and 316b have a rod shape of the first direction. The source electrode 314 is disposed between the first and second patterns 316a and 316b of the drain electrode and substantially entirely overlaps the gate line 302 and the gate electrode 304. The first and second patterns 316a and 316b of the drain electrode cross the gate electrode 304.

A pixel electrode 322 is formed in each of the first and second regions P1 and P2. The pixel electrode 322 in the first region P1 is connected to the first pattern 316a of the drain electrode, and a pixel electrode 322 in the second region P2 is connected to the second pattern 316b of the drain electrode. Portions of the first and second patterns 316a and 316b, which are connected to the pixel electrodes 322, may have larger areas than other portions of the first and second patterns 316a and 316b, which overlap the gate electrode 304.

The pixel electrode 322 overlaps the common line 306 in each of the first and second regions P1 and P2 to form a storage capacitor, wherein the common line 306 functions as a first electrode, and the pixel electrode 322 serves as a second electrode.

In FIG. 13, a switching element, the thin film transistor T, drives two divided regions of one pixel region. Since the drain electrode 316a and 316b crosses the gate electrode 304, an overlapping area of the gate electrode 304 and the drain electrode 316a and 316b does not change even if the drain electrode 316a and 316b is misaligned with the gate electrode 304 during the manufacturing processes. Therefore, the offset voltage $\Delta V_p$ due to a parasitic capacitance $C_{gd}$ between the gate and drain electrodes 304 and 316a and 316b does not change, and thus a high quality LCD device can be manufactured.

Figure 14:
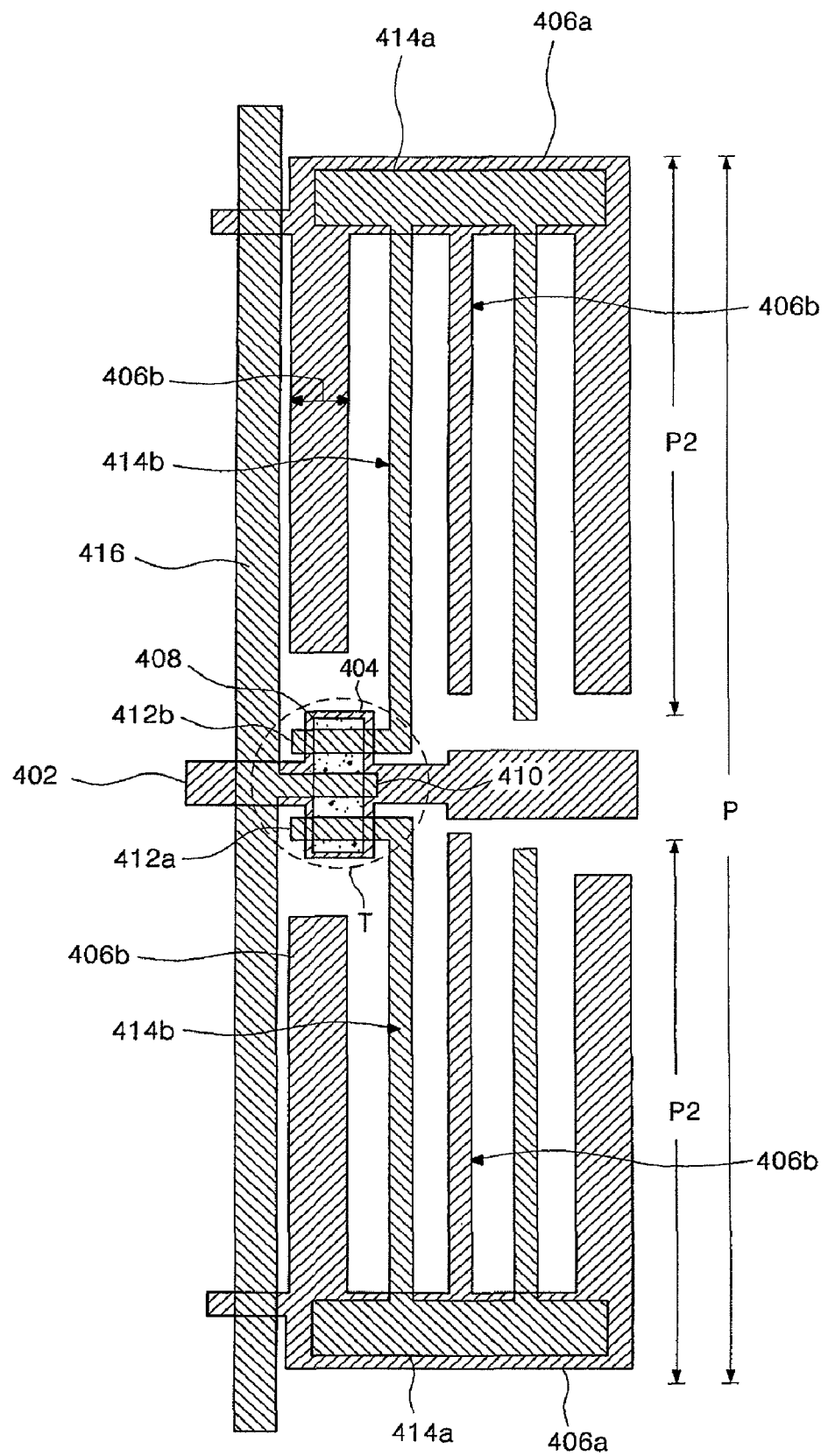
FIG. 14 is a plan view of an array substrate for an LCD device according to a fourth embodiment of the present invention.

FIG. 14 is a plan view of an array substrate for an LCD device according to a fourth embodiment of the present invention, and shows an array substrate for an in-plane switching LCD device.

In FIG. 14, a gate line 402 is formed in a first direction, and a data line 416 is formed in a second direction. Common lines 406a are formed parallel to the gate line 402 such that the gate line 402 is disposed between the common lines 406a. The data line 416 crosses the gate line 402 and the common lines 406a to define a pixel region P. The gate line 402 goes across the pixel region P, and thus the pixel region P is divided into first and second regions P1 and P2.

A thin film transistor T is formed at a crossing portion of the gate and data lines 402 and 416. The thin film transistor T includes a gate electrode 404, a semiconductor layer 408, a source electrode 410 and a drain electrode 412a and 412b. The semiconductor layer 408 is disposed between the gate electrode 402 and the source and drain electrodes 410 and 416a and 416b. The gate electrode 404 extends from the gate line 402 in the second direction, and the semiconductor layer 408 has an island shape. The source electrode 410 extends from the data line 416 in the first direction and overlaps the gate electrode 404 and the gate line 402. The drain electrode includes first and second patterns 412a and 412b parallel to the source electrode 410, and the source electrode 410 is disposed between the first and second patterns 412a and 412b. The first and second patterns 412a and 412b of the drain electrode cross the gate electrode 404.

A common electrode 406b is formed in each of the first and second regions P1 and P2 of the pixel region P. The common electrode 406b includes a plurality of patterns, which extend from the common line 406a in each of the first and second regions P1 and P2 along the second direction. A pixel connecting line 414a of the first direction is formed in each of the first and second regions P1 and P2, and the pixel connecting line 414a overlaps the common line 406a in each of the first and second regions P1 and P2 to form storage capacitor. A pixel electrode 414b of the second direction is formed in each of the first and second regions P1 and P2. The pixel electrode 414b includes a plurality of patterns of the second direction. The patterns of the pixel electrode 414b are connected to the pixel connecting line 414a in each of the first and second regions P1 and P2. The patterns of the pixel electrode 414b alternate with the pattern of the common electrode 406b in each of the first and second regions P1 and P2. One pattern of the pixel electrode 414b in the first region P1 is connected to the first pattern 412a of the drain electrode, and one pattern of the pixel electrodes 414b in the second region P2 is connected to the second pattern 412b of the drain electrode. The pixel electrode 414b of the first region P1 and the first pattern 412a are formed in one united body, and the pixel electrode 414b of the second region P2 and the second pattern 412b are formed in one united body.

The array substrates of the third and fourth embodiments may be manufactured according to the processes for the array substrates of the first and second embodiments, respectively.

In the present invention, the drain electrode crosses the gate electrode. Thus, although the drain electrode may be misaligned during the processes, an overlapping area of the drain electrode and the gate electrode does not change. Accordingly, an offset voltage $\Delta V_p$ due to the change of a parasitic capacitance $C_{gd}$ may be unchanged, whereby a high quality LCD device can be manufactured.

It will be apparent to those skilled in the art that various modifications and variations can be made in the fabrication and application of the invention without departing from the spirit or scope of the invention. Thus, it is intended that the invention cover the modifications and variations of this invention provided they come within the scope of the appended claims and their equivalents.

What is claimed is:

1. A thin film transistor comprising:
   a gate electrode formed along a portion of a gate line in a first direction and defined by an expanded area having a width greater than a width of the gate line;
   a semiconductor layer on the gate electrode; and
   source and drain electrodes on the semiconductor layer, the drain electrode crossing the entire expanded area of the gate electrode such that an area of overlap between the drain electrode and the expanded area remains constant for a predetermined change in placement of the drain electrode relative to the gate electrode,
   wherein the source and drain electrodes extend in the same direction, and wherein the drain electrode includes first and second patterns, and the source electrode is disposed between the first and second patterns.

2. The thin film transistor according to claim 1, wherein the drain electrode is substantially L shaped.

3. The thin film transistor according to claim 1, wherein the gate line and the source and drain electrodes all extend in the same direction.

4. The thin film transistor according to claim 1, wherein the drain electrode is substantially not symmetric around the gate electrode.

5. An array substrate for a liquid crystal display device, the array substrate comprising:
   a gate line;
   common lines parallel to the gate line, the gate line disposed between the common lines;
   a data line crossing the gate line and the common lines to define a pixel region, the pixel region divided into first and second regions by the gate line;
   a thin film transistor at a crossing portion of the gate and data lines, the thin film transistor comprising:
   a gate electrode formed along a portion of the gate line and defined by an expanded area having a width greater than a width of the gate line;
   a semiconductor layer on the gate electrode; and
   source and drain electrodes on the semiconductor layer, the drain electrode crossing the entire expanded area of the gate electrode such that an area of overlap between the drain electrode and the expanded area remains constant for a predetermined change in placement of the drain electrode relative to the gate electrode; and
   a pixel electrode in each of the first and second regions, the pixel electrodes connected to the drain electrode,
   wherein the source and drain electrodes extend in the same direction, and wherein the drain electrode includes first and second patterns, and the source electrode is disposed between the first and second patterns.

6. The array substrate according to claim 5, wherein the pixel electrode in the first region is connected to the first pattern of the drain electrode, and the pixel electrode in the second region is connected to the second pattern of the drain electrode.

7. The array substrate according to claim 5, wherein the drain electrode extends parallel to the gate line.

8. The array substrate according to claim 5, wherein the drain electrode is not symmetric around the gate electrode.

9. A method of manufacturing an array substrate for a liquid crystal display device, the method comprising:
   forming a gate line on a substrate;
   forming common lines parallel to the gate line, the gate line disposed between the common lines;
   forming a data line crossing the gate line and the common lines to define a pixel region, the pixel region divided into first and second regions by the gate line;
   forming a thin film transistor at a crossing portion of the gate and data lines, the thin film transistor comprising:
   a gate electrode formed along a portion of the gate line and defined by an expanded area having a width greater than a width of the gate line;
   a semiconductor layer on the gate electrode; and
   source and drain electrodes on the semiconductor layer, the drain electrode crossing the entire expanded area of the gate electrode such that an area of overlap between the drain electrode and the expanded area remains constant for a predetermined change in placement of the drain electrode relative to the gate electrode; and
   forming a pixel electrode in each of the first and second regions, each pixel electrode connected to the drain electrode,
   wherein the source and drain electrodes extend in the same direction, and wherein the drain electrode includes first and second patterns, and the source electrode is disposed between the first and second patterns.

10. The method according to claim 9, wherein the pixel electrode in the first region is connected to the first pattern of the drain electrode, and the pixel electrode in the second region is connected to the second pattern of the drain electrode.

* * * * *